United States Patent
Wu et al.

(10) Patent No.: US 9,290,847 B2
(45) Date of Patent: Mar. 22, 2016

(54) AL$_2$O$_3$ OR AL$_2$O$_3$-CONTAINED MULTILAYER COATINGS FOR SILICON NITRIDE CUTTING TOOLS BY PHYSICAL VAPOR DEPOSITION AND METHODS OF MAKING THE SAME

(71) Applicant: GUANGDONG UNIVERSITY OF TECHNOLOGY, Guangzhou, Guangdong Province (CN)

(72) Inventors: Shanghua Wu, Guangdong (CN); Ying Long, Guangdong (CN); Qimin Wang, Guangdong (CN); Chengyong Wang, Guangdong (CN)

(73) Assignee: GUANGDONG UNIVERSITY OF TECHNOLOGY, Guangzhou, Guangdong Province (CN)

( * ) Notice: Subject to any disclaimer, the term of this patent is extended or adjusted under 35 U.S.C. 154(b) by 0 days.

(21) Appl. No.: 14/138,427

(22) Filed: Dec. 23, 2013

(65) Prior Publication Data

US 2014/0178659 A1 Jun. 26, 2014

Related U.S. Application Data

(60) Provisional application No. 61/745,871, filed on Dec. 26, 2012.

(51) Int. Cl.
*C23C 14/06* (2006.01)
*C23C 28/00* (2006.01)
(Continued)

(52) U.S. Cl.
CPC ............... *C23C 28/42* (2013.01); *C23C 14/081* (2013.01); *C23C 28/04* (2013.01); *C23C 28/042* (2013.01); *C23C 28/044* (2013.01); *Y10T 428/24975* (2015.01); *Y10T 428/265* (2015.01)

(58) Field of Classification Search
USPC ............ 51/307, 309; 428/216, 336, 469, 698, 428/699, 701, 702, 7; 407/119
See application file for complete search history.

(56) References Cited

U.S. PATENT DOCUMENTS 4,421,525 A * 12/1983 Sarin et al. ...................... 51/295
4,892,792 A *  1/1990 Sarin et al. .................... 428/698

(Continued)

FOREIGN PATENT DOCUMENTS

| JP | 2002-053946 | * | 2/2002 |
| JP | 2005-262355 | * | 9/2005 |
| JP | 2005-262356 | * | 9/2005 |

*Primary Examiner* — Archene Turner
(74) *Attorney, Agent, or Firm* — Nixon Peabody LLP; Jeffrey L. Costellia

(57) ABSTRACT

The present invention provides an Al$_2$O$_3$ coated Si$_3$N$_4$ cutting tool comprising a Si$_3$N$_4$ based substrate body and a coating layer on the substrate body, wherein the coating layer has at least one Al$_2$O$_3$ coating layer consisting of amorphous Al$_2$O$_3$ or nanocrystalline α-, γ-, or κ-Al$_2$O$_3$. The hard and wear resistant refractory coating is deposited onto the Si$_3$N$_4$-based substrate body by reactive sputtering using bipolar pulsed DMS technique or dual magnetron sputtering method at substrate temperatures of 300-700° C. During the deposition, preferably, the substrate temperature is controlled to achieve the desired crystal structure of the coating. To form amorphous Al$_2$O$_3$ coating on the surface of the substrates, the deposition temperature can be controlled from 300 to 500° C.; on the other hand, to form nanocrystalline α-, γ-, or κ-Al$_2$O$_3$, the deposition temperature can be controlled in the range of 500-700° C. The coated cutting tools of the present invention are suitable for high-speed machining of metals by turning, milling, drilling or by other similar chip-forming machining methods.

20 Claims, 2 Drawing Sheets

(51) Int. Cl.
*C23C 28/04* (2006.01)
*C23C 14/08* (2006.01)

(56) References Cited

U.S. PATENT DOCUMENTS

| | | | | |
|---|---|---|---|---|
| 4,984,940 A * | 1/1991 | Bryant et al. | ................ | 407/119 |
| 5,118,645 A * | 6/1992 | Pyzik et al. | ................ | 501/98.1 |
| 5,310,607 A * | 5/1994 | Schulz et al. | ................ | 428/697 |
| 5,525,134 A * | 6/1996 | Mehrotra et al. | ............... | 51/307 |
| 5,914,286 A * | 6/1999 | Collin et al. | ................ | 407/119 |
| 6,333,099 B1 * | 12/2001 | Strondl et al. | ................ | 428/216 |
| 6,383,624 B1 * | 5/2002 | Soderberg et al. | ............. | 425/472 |
| 6,423,403 B2 * | 7/2002 | Schiller et al. | ................ | 428/701 |
| 6,451,180 B1 * | 9/2002 | Schiller et al. | ........... | 204/192.15 |
| 6,767,627 B2 * | 7/2004 | Morikawa et al. | ............ | 428/699 |
| 7,670,674 B2 * | 3/2010 | Schier | ........................... | 428/702 |
| 7,674,520 B2 * | 3/2010 | Schier | ........................... | 428/697 |
| 7,939,181 B2 * | 5/2011 | Ramm et al. | ................ | 428/701 |
| 7,968,182 B2 * | 6/2011 | Trinh et al. | ................... | 428/697 |
| 8,080,312 B2 * | 12/2011 | McNerny et al. | ............. | 428/336 |
| 8,137,795 B2 * | 3/2012 | Omori et al. | ................ | 428/216 |
| 2009/0078565 A1 * | 3/2009 | Rodmar et al. | ........... | 204/192.16 |

\* cited by examiner (a) RNG45T0220  (b) SNG45T0220  (c) TNG45T0220

AL$_2$O$_3$ OR AL$_2$O$_3$-CONTAINED MULTILAYER COATINGS FOR SILICON NITRIDE CUTTING TOOLS BY PHYSICAL VAPOR DEPOSITION AND METHODS OF MAKING THE SAME

FIELD OF THE INVENTION

The present invention relates to coated ceramic cutting tools, and particularly, to Si$_3$N$_4$-based cutting tools having at least a layer of Al$_2$O$_3$ coating formed by PVD method.

BACKGROUND OF THE INVENTION

Continuously increasing demand for higher productivity in machining difficult-to-cut materials is driving the development of high-performance cutting tool materials and cutting approaches. To achieve high machining productivity, a marked trend in cutting tools is to increase cutting speed. However, for cutting speeds in excess of 1500 sfm (surface feet per minute), the cemented carbide tools which are widely used now will lose their strength and the tool nose will be deformed due to the high temperature (usually over 800° C.) introduced by high speed cutting. These will also affect the dimensional tolerance of the workpiece and lead to a shorter tool life. Coolant is usually used in machining to reduce the temperature at the cutting edge and thus extend the tool life. However, to the concern in cost saving and environmental protection, dry cutting operations are always required.

With high resistance to heat and wear, superior hot hardness and chemical stability, ceramic cutting tools can be used to machine metals that are extremely hard and abrasive. These unique properties of ceramics can also allow them to be used to machine metals at much higher cutting speeds than the carbide tools even in dry machining conditions. The most commonly used ceramic materials for cutting tools are alumina and silicon nitride. Alumina based materials are excellent candidates for cutting tools because of their good chemical stability and abrasion resistance at high temperature. However, intrinsic brittleness, low strength and low thermal shock resistance of the alumina based ceramic cutting tools limit their applications. Silicon nitride based cutting tools, which have good wear resistance, high hardness, excellent high-temperature properties, and most importantly, better fracture toughness than the alumina based cutting tools, are widely used in machining metals, more particularly for machining cast iron at high speeds. Typically, the fracture toughness of Si$_3$N$_4$ ceramic can be improved by adding elongated β-Si$_3$N$_4$ particles into α-Si$_3$N$_4$ materials. The increased fracture toughness is attributed to the energy dissipation during crack propagation via crack deflection and elastic bridging by the β-Si$_3$N$_4$ phase.

The Si—N bonds in Si$_3$N$_4$ materials have mostly the covalent character and, the solid-state diffusions are very slow, which prevents the densification of silicon nitride at high temperature. An efficient method of producing pore-less silicon nitride ceramic materials consists of introducing active additives during the sintering process and using pressure enhanced densification techniques, such as hot pressing (HP) or isostatic hot pressing (HIP). At the sintering temperatures, the densification facilitating substances, usually oxides (such as Al$_2$O$_3$, Y$_2$O$_3$, MgO, CeO$_2$, ZrO, BeO and La$_2$O$_3$), react with the surfaces of the Si$_3$N$_4$, forming a liquid phase, which makes possible mass transport processes and enhances the densification.

Ceramic materials such as silicon nitride have a very high electrical resistivity (1×10$^{12}$·Ω·cm), the electrical property of Si$_3$N$_4$ materials can be tuned by the addition of electro-conductive phases. Recently, there is a growing interest in synthesizing electrically conductive silicon nitride composites, while improving the mechanical properties of the sintered articles. In this context, conductive additives such as TiN, SiC, etc., are added into silicon nitride to improve its electrical conductivity. It has been reported that Si$_3$N$_4$—TiN, Si$_3$N$_4$—TiC, Si$_3$N$_4$—MoSi$_2$, Si$_3$N$_4$—SiC, Si$_3$N$_4$—TiCN, Si$_3$N$_4$—TiB and Si$_3$N$_4$—MoSi$_2$—SiC composites have been successfully synthesized. It was also reported that silicon nitride ceramic with Na$_2$O—Al$_2$O$_3$—SiO$_2$ glass as the grain boundary phases resulted in two and four orders of magnitude higher electrical conductivity than that of Si$_3$N$_4$ ceramic with Y$_2$O$_3$ and Al$_2$O$_3$ additives at 100 and 1000° C., respectively. One advantage is that such composites can be shaped into complex geometries by the more economical electrical discharge machining (EDM). The other advantage is that the strength and toughness of the sintered particles can be much improved by the addition of second-phase particles by mechanisms including residual stresses generated by the mismatch of coefficients of thermal expansion (CTE), crack bridging and crack deflection.

Moreover, ceramics based on silicon nitride offer increased resistance to abrasion and thermal shock and have high fracture toughness. Along with the new material development based on high purity ceramic powders, optimized powder processing and sintering techniques, the new silicon nitride grade is characterized by reduced content of grain boundary phase and an extremely homogeneous fine microstructure. This results in a higher bending strength and wear resistance combined with high fracture toughness especially at very high temperatures. Nowadays, Si$_3$N$_4$-based cutting tools have been widely used in high-speed machining cast alloys, hardened steels and high-Ni superalloys, especially on rough finished turning and milling, where super toughness and wear resistance are required. The Si$_3$N$_4$-based cutting tools can be used to machine cast irons, hardened steels and Ni-based superalloys with surface speeds up to 25 times higher than those obtained with conventional materials such as tungsten carbide. Furthermore, Si$_3$N$_4$ based ceramics have been found to be an excellent choice for machining grey and ductile cast irons at cutting speed over 400 m/min.

There was a predominant opinion that coating on ceramic cutting tools and inserts was meaningless, because of the high hot hardness and chemical inertness of ceramics. This opinion has been changed recently, when beneficial influence of coatings on functional properties of ceramic tools and inserts was found. On one hand, the influence of coating on increasing the tool life is interpreted by a decrease in heat emission during machining, due to a decrease in the coefficient of friction between the cutting tool and the workpiece and also due to a lower probability of chipping, by eliminating their initiation sites on the inserts. On the other hand, when the cutting speeds exceed 1500 surface feet per minute (sfm), the temperature at contact faces of the cutting inserts may be over 1000° C. due to the heat generated by dramatic friction between the cutting tools and the workpiece. Under this cutting condition, the chemical inertness of cutting tool material becomes more and more important. However, at this temperature, silicon nitride-based ceramic cutting tools exhibit lower chemical degradation than desired in machining iron-based alloys, such as cast iron and steels, due to the chemical reaction between silicon nitride and iron. Serious diffusion-related crater wear can be usually observed in this application. This crater wear is believed resulting from the chemical affinity between Si$_3$N$_4$ elements and iron alloy components that promotes tribo-chemical reactions. During high speed machining, oxidation wear occurs locally which causes notch wear at cutting edges. Therefore, chemical inertness of the cutting tool material becomes more important under high-speed, dry machining conditions.

Several ways have been developed for improving the chemical stability of the silicon nitride-based ceramic cutting tools. By addition of inert metal oxide ($SiO_2$, $Al_2O_3$, etc.) as the second phase to the $Si_3N_4$ matrix is one way to improve its chemical inertness and therefore the tool life. It is reported that wear resistance of $Si_3N_4$ tool for machining iron increased with $Al_2O_3$ content. However, higher $Al_2O_3$ content also induces higher brittleness and thus reduces the performance of silicon nitride-based ceramic cutting tools.

A more effective way to solve this problem is to apply protective coating(s) on the surface of the $Si_3N_4$ based ceramic cutting tools. The coating(s) can form an excellent thermal and chemical barrier between the tool and the workpiece, and meanwhile, can keep the excellent physical and mechanical properties of the $Si_3N_4$ ceramic materials. Therefore, the cutting performance and the tool life can be significantly improved.

Various coatings have been successfully applied on cutting tools and inserts where the tool materials are high speed steels or cemented carbide, from single, binary coatings to complex multi-component and multi-layer configurations. Among them, the most commonly used coating materials for cutting tools over the past years are transition metal nitrides, such as TiN and TiAlN. TiN coating is good for protecting cutting tools due to its high hardness and wear resistance. However, the application of TiN coating is limited to low temperatures since it tends to be oxidized at temperatures above 600° C. The oxidation resistance of TiAlN coating is much higher than that of TiN with the formation of a dense and strongly adhesive $Al_2O_3$ by Al atoms diffusing to the surface. Although the oxidation temperature of TiAlN coating can be improved to 800° C., it is still not good enough for high-speed cutting with temperatures over 1000° C.

$Al_2O_3$ has excellent wear protection, high hot hardness and stability at elevated temperatures above 1000° C., at which most nitride coatings suffer from severed and rapid oxidation. Having such various advantages, $Al_2O_3$ is a good candidate material for protective coating(s) on cutting tools to improve their productivity of machining operations, especially at high temperature under high-speed and dry machining conditions.

The most commonly used methods for producing coating layers on cutting tools are chemical vapor deposition (CVD) and physical vapor deposition (PVD). So far, due to the requirement for high deposition temperature and insulating attribute of $Al_2O_3$, the mostly used technique for producing $Al_2O_3$ and their multi-layered coatings is chemical vapor deposition (CVD). For $Si_3N_4$ cutting tools which are also insulating, the main technique to produce $Al_2O_3$ coating(s) is also CVD method.

CVD methods have been proven to be excellent processes for hard coatings and offer advantages of uniform coating even for workpiece of complicated geometries. In the past, refractory coatings, such as TiC, TiCN, TiN, and $Al_2O_3$, or their combinations, have been applied by CVD techniques. The CVD coatings on cutting tools have been developed from TiC, TiCN, TiN, and $Al_2O_3$ coatings to complex TiC/TiC/TiCN, TiC/$Al_2O_3$/TiN, TiC/TiCN/$Al_2O_3$/TiN coatings which are mostly the combination of above mentioned coating materials. In those coatings, each layer provides an attractive feature that gives superior coating properties. TiN, TiC and TiCN can increase the hardness and reduce friction from the contact forces while the $Al_2O_3$ layer provides thermal and chemical barrier under elevated temperatures.

$Al_2O_3$ crystallizes into several different phases such as α, κ, and χ called the "α-series" with hcp stacking of the oxygen atoms, and into γ, θ, η and δ called the "γ-series" with fcc stacking of the oxygen atoms. The CVD processes are normally operated at temperatures in excess of 1000° C., at which α- and κ-$Al_2O_3$ may be synthesized with grain size in the range of 0.5-5 μm and having well-facetted grain structures. However, due to the high deposition temperatures, coatings produced by CVD technique are characterized by thermal cracks, and residual tensile stresses caused by the thermal expansion mismatch between the coating and the substrate as the tool is cooled down from the processing temperature to the room temperature. The tensile stress may exceed the rupture limit of the $Al_2O_3$ to create cracks on coating. During machining, the coating may crack due to the reduction in the transverse rupture strength (TRS) of the insert which produces a greater susceptibility to chipping and breakage.

A lot of other drawbacks related to CVD process, such as coarse grain structure, explosive and corrosive reactive gas that induces dangers and corrosion of the coating chamber, environmental pollutions, limit the application of the CVD coatings. These drawbacks can be avoided in deposition processes at lower substrate temperatures for the synthesis of crystalline films, like pulsed DC (Direct current) plasma-assisted CVD, medium temperature CVD or PVD techniques. MTCVD (medium-temperature CVD) coatings, as the name implies, are deposited at lower temperatures than CVD coatings which eliminate cracks formation in the coating. As a result, MTCVD coatings offer advantages of increased toughness and smoothness without sacrificing wear resistance or crater resistance. Tools with these coatings covered have broader application ranges for ferrous materials, allowing consumers to inventory fewer grades and, therefore, suffer fewer application mistakes. By the development of plasma assisted CVD technique, coatings can also be deposited at lower temperature. At temperatures about 450-700° C., the dominance of the thermal stress can be avoided and thus the thermal distortion is reduced.

The introduction of PVD coatings for cutting tools in the metal cutting industry is one of the main success stories in the industrial application of modern coating technology over the last 30 years. The first PVD coating material for commercial application on cutting tools was TiN in the early 1980s. Since the 1990s most cutting tools have been PVD coated particularly in applications where sharp edges are required, e.g. threading, grooving, end-milling, etc. and in cutting applications that have a high demand for a tough cutting edge, e.g. drilling.

PVD methods tend to develop a residual compressive stress caused mainly due to the non-equilibrium plasma deposition environment in the coating. The compressive stress can delay the onset of thermal cracking if the coating can withstand the heat and remain adherent at the cutting edge of the tool. Once the onset of thermal cracking is delayed, tool life can be significantly enhanced during the machining operation. Other merits of the PVD coatings compared with CVD coatings include: relatively low deposition temperatures; preserving cutting edge toughness; being able to be applied to sharp cutting edges; finer grains (smoother) with higher microhardness; non-equilibrium compositions impossible with CVD.

Several PVD techniques have been developed in the past several years. For the application of coatings on cutting tools, the mainly used techniques are: cathodic arc deposition (or called arc ion plating), sputter deposition (or called magnetron sputtering), pulsed laser deposition and electron beam physical vapor deposition.

In cathodic arc deposition, a high power electric arc discharged at the target (source) material blasts away some into highly ionized vapor to be deposited onto the substrates. The principal advantage of this arc discharge is the high degree of ionization, which increases the adhesion of the film to the substrate and improves crystal growth. The disadvantage of this method is that macro-particles from cathodic spots result in voids in the films.

Sputter deposition is the deposition of particles vaporized from the target by the physical sputtering process which is a non-thermal vaporization process where the atoms are ejected from the surface of a glow plasma discharge (usually localized around the "target" by a magnet) bombards the material sputtering some away as a vapor for subsequent deposition. Uniform thin films can be obtained easily by this method, and the strong ion bombardment which is inevitable in the cathodic arc evaporation can be avoided.

In pulsed laser deposition (PLD) a high power laser ablates material from the target into a vapor and, hence, forming dense plasma inside the chamber of the evaporated material. PLD is a useful technique to produce high quality multilayer films which are continuous and smooth without using substrate heating.

Electron beam physical vapor deposition (EBPVD) is an important coating method in which the material to be deposited is heated to a high vapor pressure by electron bombardment in "high" vacuum and is transported by diffusion to be deposited by condensation on the (cooler) workpiece.

Each method mentioned above has its own merits. Coatings produced by different methods have different microstructures, grain size, and hardness, state of stress, intrinsic cohesion and adhesion to the underlying substrate bodies. The mostly utilized methods for depositing coatings on cutting tools are cathodic arc deposition and sputtering deposition. As each technique has its own limitation, many new techniques based on the cathodic arc deposition and sputtering deposition had been developed by utilizing different magnetron fields and different cathode powers. For example, the filtered arc and nano dispersed arc jet by utilizing an electromagnetic filter or a special designed magnetic field enables solution of the main drawback of macro-particle pollution in arc technology. The closed unbalanced magnetic field in magnetron sputtering, application of high power pulsed power on the magnetron cathode improves ionization in sputtering, thus leading to formation of high-quality dense films. The application of mid-frequency pulsed power and radio-frequency power on the magnetron cathode enables the deposition of not so conductive or insulating materials.

As a consequence of recent developments in PVD technology, many new coatings have been developed. Coatings made of oxide, nitride and super-hard materials have come to the marketplace. The coatings on the cutting tools involved are mainly nitrides, starting from binary nitrides (TiN, CrN, etc.) to ternary nitrides (TiCN, TiAlN, etc.), up to multi-component nitrides (TiSiN, TiAlSiN, TiAlCrYN, etc.) and multilayered nitride systems (TiN/NbN, TiAlN/VN, TiAlN/CrN, etc.). The coating microstructure also evolved from columnar micrometer coatings to nanocrystalline coatings, nanolayer/superlattice coatings and nanocomposite coatings.

The development of PVD coatings followed the steps: $1^{st}$ generation (1970): pseudo ceramic materials based on binary compounds (TiN, TiC, TiB$_2$, etc.); $2^{nd}$ generation (1985): ternary and quaternary interstitial solid solutions (Ti—Al—N, Ti—Al—N—C, etc.); $3^{rd}$ generation (1990): multilayer structures (M/MN/M and MN/MC/MN, etc., where M—metallic component); $4^{th}$ generation (up to date): nanolaminated coatings (TiN/NbN, TiN/WN, TiAlN/CrN, TiN/AlN, etc.) and nanocomposite coatings (Me-Si—N, Me=Ti, Cr, TiAl, CrAl, etc.). The $1^{st}$-$3^{rd}$ generation coatings are already commercialized. The $4^{th}$ generation coatings has been investigated in some institutes/universities and coating companies. These coatings can be tailored to have high hot hardness, low friction coefficient, and good toughness, etc. Some of them have been applied on cutting tools. For example, nanocomposite coatings (e.g. nc-TiAlN/a-Si$_3$N$_4$, nc-AlCrN/a-Si$_3$N$_4$, nc-AlTiCrN/a-Si$_3$N$_4$) have been applied on high-speed steel tools and cemented carbide tools to obtain much higher tool life than the conventional TiN, TiAlN coated cutting tools. Efforts have been conducted to coat nanocomposite on ceramic cutting tools such as oxide and nitride ceramic tools by PVD techniques. It seems that the nanocomposite coating as a hard interlayer of a multilayer Al$_2$O$_3$-containing coating by PVD method has not been related.

One of the PVD methods to produce insulating films such as Al$_2$O$_3$ is radio frequency (RF) sputtering. This method can produce highly uniform films with good adherence to the substrate. However, extremely low deposition rate caused by the small DC-voltage which is generated at the target and ever growing technique problems for increasing substrate sizes have limited the use of these layers to a few applications because of the high coating costs.

Another way, the DC sputtering, which is used to grow oxides, nitrides and carbides due to the simplicity of the process, forms aluminum in a reactive argon-oxygen gas mixture. But this method cannot be performed as a stable long-term mode. Insulating layers are deposited not only on the substrate but equally on the chamber walls and on regions of the sputter targets. Here electric charges will occur that, in turn, result in arcing and therefore in a damage of the layers. Moreover, the anode function of the chamber wall or special electrodes will be impaired by insulating layers within a very short time so that the discharge extinguishes. If the target is insulated or parts of its surface becomes insulating as a result of the target poisoning by reactive gases, the charging up of Ar$^+$ ions on the target surface takes place. This prevents the later incoming Ar$^+$ ions from reaching the target so that the sputtering process cannot carry on further. As a result, no more secondary electrons are ejected from the target so that the glow discharge plasma cannot maintain itself and the deposition process stops. In addition, the accumulation of the Ar$^+$ ions on insulating spots usually causes violent arcs which lead to damage of the power supply.

The utilization of bipolar pulsed power on the cathode enables deposition of dielectric films at a fairly high growth rate without target poisoning and arcing. And the deposition rate can be enhanced as compared with RF sputtering. By utilizing the bipolar pulsed power (i.e., alternatively applying a positive and negative voltage), the surface is continuously discharged. The effect of the positive pulse is to draw electrons in the plasma toward the target where they can neutralize the accumulated Ar$^+$ ions. If the pulse duration (pulse width) and the height of the positive pulse are just enough to produce an electron current that can discharge all the accumulated Ar$^+$ ions on the target, the repelling effect on the incoming Ar$^+$ ions when the target voltage turns negative is eliminated. This keeps the sputtering process going and the discharge plasma can be self-maintaining. Furthermore, application of the positive pulse can lead to preferential sputtering of the poisoned spots on the target. This helps to eliminate target poisoning and arcing. Therefore, reactive magnetron sputtering deposition of oxide compounds or sputtering deposition of oxide compounds such as $Al_2O_3$, $ZrO_2$, $TiO_2$, and ZnO, is enabled by the introduction of bipolar pulsed-dc power on the sputtering cathode.

With the invention and development of the bipolar pulsed DMS (Dual Magnetron Sputtering) technique, it becomes possible to produce crystalline insulating layers such as $Al_2O_3$ by PVD methods. In the bipolar dual magnetron system, two magnetrons alternately act as anode and cathode and, hence, preserve a metallic anode over long process times. Bipolar pulsed dual magnetron sputtering enables high power input into the plasma during the pulsed, thus creating dense plasma with highly energetic particles. When the frequencies are high enough, possible electron charging on the insulating layers will be suppressed and the otherwise troublesome phenomenon of "arcing" will be limited. The bipolar pulsed DMS technique provides wide opportunities for depositing and producing high-quality, well-adherent, $\alpha$-$Al_2O_3$ thin hard films on cutting tools. In addition, the technique involves stable process conditions within a large process window as compared to other sputtering techniques, as well as high deposition rate for insulating coatings such as $Al_2O_3$ according to U.S. Pat. No. 6,673,430 B2 and U.S. Pat. No. 6,423,403 B2, a $\gamma$-$Al_2O_3$ layer with grain size less than 0.1 μm and free of cracks and halogen impurities is deposited utilizing a DMS technique at substrate temperatures in the range 450° C. to 700° C., preferably at 550° C. to 650° C.

Another possible PVD method for depositing $Al_2O_3$ coatings on cutting tools is by the present invention of dual magnetron sputtering metal-doped conductive $Al_2O_3$ ceramic targets in an Ar gas or Ar+$O_2$ atmosphere. In this technique, the nonconductive $Al_2O_3$ ceramic is doped by metals such as Al, Ti, Cr, Nb, Pt or conductive ceramics such as SiC. The conductive doped $Al_2O_3$ ceramic target is used as cathode applied with an asymmetrical bipolar pulsed power. Both of these two techniques had not been utilized previously for depositing $Al_2O_3$ coating layers on $Si_3N_4$-based cutting tools.

BRIEF SUMMARY OF THE INVENTION

The present invention is made in view of the above described circumstances that fail to deposit $Al_2O_3$ coating layers on $Si_3N_4$-based cutting tools using PVD methods, and provides methods for producing such cutting tools or cutting tool inserts suitable for metal machining such as turning, milling, drilling or by similar chip-forming machining methods.

Since the $Si_3N_4$ based ceramics are not electrically conductive, they are difficult to be coated with protective ceramic layers by conventional PVD technique. One technical problem of this invention to solve is to produce coating(s) by PVD technique on $Si_3N_4$ based ceramic substrates which are electrically insulating.

Another technical problem of this invention to solve is to produce electrically insulating $Al_2O_3$ coating(s) on $Si_3N_4$ based ceramic substrates by PVD technique.

A third technical problem of this invention to solve is to improve the performance and service life of $Al_2O_3$ coating(s) or $Al_2O_3$-containing coating(s) on $Si_3N_4$ based ceramic cutting tools under high-speed, dry machining conditions for machining cast iron or other hardened materials.

The present invention provides an $Al_2O_3$ coated $Si_3N_4$ cutting tool comprising a $Si_3N_4$ based substrate body and a coating layer on the substrate body, wherein the coating layer has at least one $Al_2O_3$ coating layer consisting of amorphous $Al_2O_3$ or nanocrystalline $\alpha$-, $\gamma$-, or $\kappa$-$Al_2O_3$.

In an implementation of the present invention, the hard and wear resistant refractory coating is deposited onto the $Si_3N_4$-based substrate body by reactive sputtering using bipolar pulsed DMS technique or dual magnetron sputtering method at substrate temperatures of 300-700° C. During the deposition, preferably, the substrate temperature is controlled to achieve the desired crystal structure of the coating. To form amorphous $Al_2O_3$ coating on the surface of the substrates, the deposition temperature can be controlled from 300 to 500° C.; on the other hand, to form nanocrystalline $\alpha$-, $\gamma$-, or $\kappa$-$Al_2O_3$, the deposition temperature can be controlled in the range of 500-700° C.

In a preferable implementation of the present invention, the $Al_2O_3$ coating layer is deposited utilizing reactive sputtering by bipolar pulsed DMS technique or dual magnetron sputtering conductive $Al_2O_3$ ceramic target formed by doping conductive material in $Al_2O_3$. In the first method, the $Al_2O_3$ coating layer is deposited utilizing reactive sputtering of Al cathode in an $O_2$ gas or a gas mixture of Ar and $O_2$ with process pressure of 0.1-2 Pa at substrate temperature of 300-700° C. by bipolar pulsed DMS technique. In the second method, the $Al_2O_3$ coating layer is deposited by sputtering conductive $Al_2O_3$ ceramic target in an Ar gas or a gas mixture of Ar and $O_2$ with process pressure of 0.1-2 Pa at substrate temperature of 300-700° C.

Three kinds of coatings are provided according to the present invention: single-layer alumina coating; multilayer coating consisting of a hard nitride interlayer and an $Al_2O_3$ coating layer; multilayered or nanolayered coatings consisting of alternating thin layers of hard nitride layer and $Al_2O_3$ coating layer. The $Al_2O_3$ layer is mainly composed of Al and O species with chemical composition close-to-stoichiometric of $Al_2O_3$ which is either amorphous or nanocrystalline or a combination of both. The hard nitride layer is binary nitride (TiN, CrN, etc.), ternary nitride (TiCN, TiAlN, etc.), or multi-components nitride (TiSiN, TiAlSiN, TiAlCrYN, etc.) layers or their multi-layers or nano layers.

The $Al_2O_3$ coating layer plays a key role in chemical barrier to insulate the $Si_3N_4$ based ceramic base materials from oxygen and other active elements in the workpiece. And the inner nitride layer can provide good adhesion between the coating and the substrate as well as superior heat and wear resistance. The superior mechanical properties of the cutting tools can be guaranteed by the $Si_3N_4$ based ceramic base materials which can be used at high temperature.

In a preferable implementation of the present invention, a $Si_3N_4$ substrate body with 1-5 wt % metal oxide additive(s) selected from $SiO_2$, $Al_2O_3$, MgO, $Y_2O_3$, $ZrO_2$, $La_2O_3$, and their mixtures is produced. By adjusting the amount of densification additives, dense substrate body with excellent mechanical properties can be obtained. In addition, an asymmetrical bipolar pulsed power with reversed positive is applied as a bias voltage during PVD process to produce coatings on $Si_3N_4$ based ceramic substrates which are electrically insulating.

In another preferable implementation of the present invention, conductive additives such as TiC, TiN, TiCN, SiC, $MoSi_2$, $TiB_2$ and $MoSi_2$+SiC, etc. can be added into the substrate body. So that the composite articles can be tailored to be conductive and the coatings can be deposited on them by the conventional PVD methods which does not work on the insulating substrates.

Having the structure described above, the $Al_2O_3$ and $Al_2O_3$-containing layers coated on the $Si_3N_4$ based ceramic cutting tools or cutting inserts have distinguished advantages that combine excellent mechanical properties of the substrate and superior chemical inertness, superior wear resistance, and superior heat resistance of the coatings at high cutting temperatures over 1000° C. With the $Al_2O_3$ and $Al_2O_3$-containing layers, the chemical reaction between $Si_3N_4$ ceramic cutting tools and iron alloy components during high speed machining can be avoided or can be reduced significantly. The performance of the cutting tools is therefore improved considerably.

BRIEF DESCRIPTION OF THE DRAWINGS

Further advantages and details of the present invention emerge from the example embodiments described below, which do not limit the invention in any way, and from the drawings, in which.

DETAILED DESCRIPTION OF THE INVENTION

Figure 1:
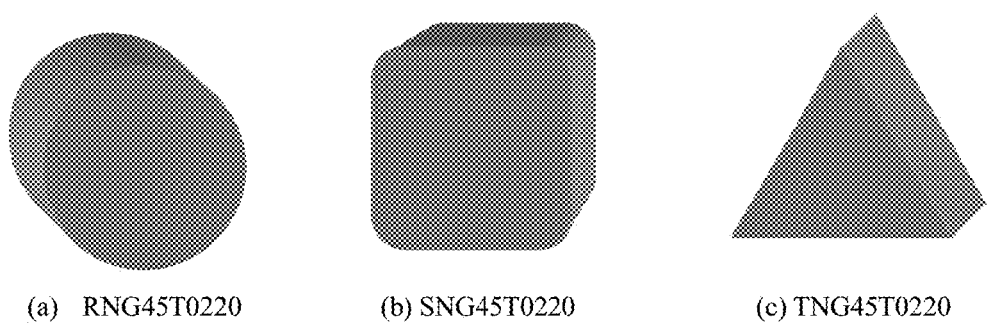
FIG. 1 shows examples of the ceramic substrate articles where the present invention produced: (a) RNG45T0220; (b) SNG45T0220 and (c) TNG45T0220.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" include any and all combinations of one or more of the associated listed items. It will be further understood that the terms "comprises" "comprising" "includes" and/or "including" when used herein, specify the presence of stated features, integers, steps, operations, elements, and/or components, but do not preclude the presence or addition of one or more other features, integers, steps, operations, elements, components, and/or groups thereof.

The coated $Si_3N_4$ based ceramic cutting tools and cutting tool inserts according to the present invention comprise a substrate body and an overlay hard coating. The substrate body of the cutting tools and cutting inserts is $Si_3N_4$ based ceramic which has good wear resistance, high hardness, excellent high-temperature properties and fracture toughness. The cutting tools with surface coatings are used for high-speed, dry machining cast alloys, hardened steels and high-Ni superalloys, especially on rough finish turning and milling. The wear resistant coating is composed of single layer of $Al_2O_3$ or contains multi layers of refractory compounds, of which at least one layer of $Al_2O_3$ exists.

In an implementation of the present invention, the coatings include one or more layers of which at least one layer is $Al_2O_3$. The $Al_2O_3$ layer is mainly composed of Al and O species with close-to-stoichiometric $Al_2O_3$ composition. The phase structure can be amorphous or nanocrystalline $\alpha$-, $\gamma$-, or $\kappa$-$Al_2O_3$.

In a preferable implementation of the present invention, the $Al_2O_3$ layer is deposited utilizing reactive sputtering by bipolar pulsed DMS technique or dual magnetron sputtering conductive $Al_2O_3$ ceramic targets with conductive materials additive.

In the first method, a symmetrical bipolar pulsed power is applied on the cathode target. The material of the cathode is pure Al target. The $Al_2O_3$ layer is fabricated by reactive sputtering of Al target in $O_2$ gas or a gas mixture of Ar and $O_2$ with process pressure of 0.1-2 Pa at substrate temperature of 300-700° C.

In the second method, an asymmetrical bipolar pulsed power with reversed positive voltage is applied on the cathode target. The material of the cathode is a conductive alumina that is made by adding conductive materials. The conductive $Al_2O_3$ ceramic target consists of $Al_2O_3$ and 0.3-20 wt % doping material comprising Al, Ti, Cr, Nb, Pt or SiC. The additive material can be metals, such as Al, Ti, Cr, Nb, Pt or conductive ceramics such as SiC, with additive content of 0.3-20 wt %. The $Al_2O_3$ layer is fabricated by sputtering of doped $Al_2O_3$ target in Ar gas or a gas mixture of Ar and $O_2$ with process pressure of 0.1-2 Pa at substrate temperature of 300-700° C.

During deposition, a bipolar pulsed power is applied, with positive and negative bias voltage in the range of 20-50V and 20-300V, respectively. The frequency and duty cycle ratio is in the range of 5-100 kHz and 10-70%, respectively. The utilization of bipolar pulsed power on the sputtering target and utilization of high frequency bipolar pulsed bias voltage is to realize deposition of non-conductive deposition of oxide/nitride films and avoid the arcing on the targets and substrates.

In an implementation of the present invention, the $Si_3N_4$ based substrate body consists of $Si_3N_4$-based composite comprising $Si_3N_4$—TiN, $Si_3N_4$—TiC, $Si_3N_4$—$MoSi_2$, $Si_3N_4$—SiC, $Si_3N_4$—TiCN, $Si_3N_4$—$TiB_2$ or $Si_3N_4$—$MoSi_2$—SiC, etc., and the $Al_2O_3$ coating layer is deposited utilizing physical vapor deposition technique. The composite articles added with conductive phases can be tailored to be conductive so that coatings can be deposited on them by conventional PVD methods which does not work on the insulating substrates.

In a preferable implementation of the present invention, the amount of additives such as TiC, TiN, TiCN, SiC, $MoSi_2$, $TiB_2$ and $MoSi_2$—SiC comprises 3-5 wt % of the substrate body.

Since the strength of the cutting tools decreases with increasing porosity of the compact, it is important that the compact is densified to a density as close as possible as to the theoretical density. In an implementation of the present invention, the $Si_3N_4$ based composite has a density of at least 98% of theoretical density using ceramic processing. The powder blends employed as starting mixtures for tool substrates of the present invention are densified to a density of at least 98% of theoretical density by pressing followed by sintering, hot-pressing, gas over-pressure sintering, or hot isostatic pressing in a non-oxidizing atmosphere.

Temperatures employed for sintering are at 1600-2200° C. Hot-pressing is carried out at pressures greater than about 10 MPa at temperatures of 1600-1900° C. Gas pressure sintering (GPS) can be carried out at pressures of 5 MPa-20 MPa and at temperatures ranging from about 1600° C. to 1950° C. Hot isostatic pressing (HIP) can be carried out at pressures around 50 MPa and above at temperatures of 1600-1900° C. Sintering can be also carried out without pressure at temperatures of 1600-2200° C. for 1-5 hours. Sintering is preferably carried out in a non-reactive atmosphere to prevent formation of undesirable oxide or oxynitride phases.

In an implementation of the present invention, the $Si_3N_4$ based substrate body comprises a refractory phase comprising a densification additive selected from a group consisting of $SiO_2$, $Al_2O_3$, MgO, $Y_2O_3$, $HfO_2$, $ZrO_2$, $La_2O_3$ and mixtures thereof. The substrate body can consist of a first phase of $Si_3N_4$ and a second refractory phase comprising $Si_3N_4$ and a densification additive selected from the group consisting of $SiO_2$, $Al_2O_3$, MgO, $Y_2O_3$, $ZrO_2$, $La_2O_3$, and their mixtures thereof. With the addition of the metal oxide densification additives, the composite articles have much improved strength, fracture toughness, and wear resistance.

The densification additive is employed from a lower effective amount which permits full densification to an upper amount which does not unduly affect the high temperature properties of the body. Preferably the metal oxide densification additive comprises from about 1 to 25 weight percent of the substrate body. More preferably, the metal oxide densification additive comprises from about 1 to 5 weight percent of the substrate body. The starting powders with these compositions were fully mixed and then sintered by conventional techniques such as hot pressing or hot isostatic pressing sintering to fully dense and homogeneous articles.

In an implementation of the present invention, the coating layer has a total thickness of 1-20 μm, preferably of 2-10 μm, and more preferably of 3-8 μm. When the thickness of the coating falls below 1 μm, the coating may have poor wear resistance and may be easily worn out during cutting process. Thus, the cutting performance and tool life of the cutting tools cannot be improved. Further, when the coating thickness is over 20 μm, the adhesion strength between the substrate and the coating material becomes weak due to high compressive residual stress and the coating may crack or spall off from the substrate or even be damaged. This may shorten the life of the cutting tools. The thickness of the coatings or the individual layers can be adjusted by increasing or decreasing the deposition time.

In an implementation of the present invention, the coating is produced by physical vapor deposition technique. The substrate bodies produced by the methods detailed or the intermediate adherent coating layers are coated with nitride or oxide coatings by physical vapor deposition techniques. In an implementation of the present invention, before the coating layer is deposited, the substrate body or the substrate articles are grounded or polished or gentle wet/dry blasting and cleaned and then moved into a vacuum chamber of the coating equipment. The base pressure of the vacuum chamber is around $10^{-4}$-$10^{-2}$ Pa. The substrate temperature is 300-700° C. Before coating deposition, the substrate body or the substrate articles are plasma cleaned and etched by plasma etching utilizing a high-frequency bipolar pulsed bias voltage or an ion source for 2-60 min, preferably to be 5-30 min. An Ar gas or a gas mixture of Ar and $O_2$ with process pressure in the range of 0.1-10 Pa is adopted.

Three types of coatings are produced according to the present invention.

Figure 2:
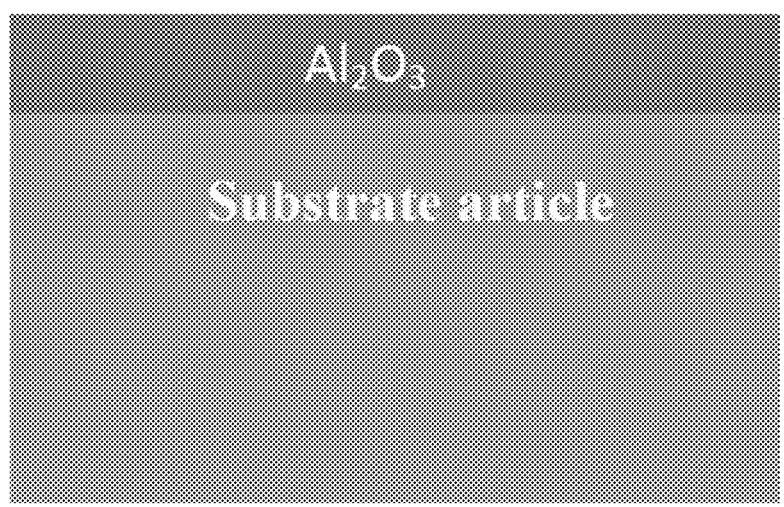
FIG. 2 is a schematic figure of a single-layer alumina coating grew on the substrate article according to one implementation of the present invention.

In an implementation of the present invention, as shown in FIG. 2, the coating layer consists of single $Al_2O_3$ coating layer with thickness of 1-10 μm. The $Al_2O_3$ coating layer is deposited utilizing methods described above. The $Al_2O_3$ layer is mainly composed of Al and O species with close-to-stoichiometric $Al_2O_3$ composition. The coating is amorphous or consists of $Al_2O_3$ nanocrystals depending on the deposition temperature. Normally, the amorphous $Al_2O_3$ is formed at the temperature from 300 to 500° C. while the nanocrystalline is formed at the temperature in the range of 500-700° C. The thickness of the $Al_2O_3$ coating is controlled by increasing or decreasing the deposition time. The $Al_2O_3$ coating layer mainly serves as the thermal and chemical barriers providing the most stable blades of the cutting tools when contacting the machined materials.

Figure 3:
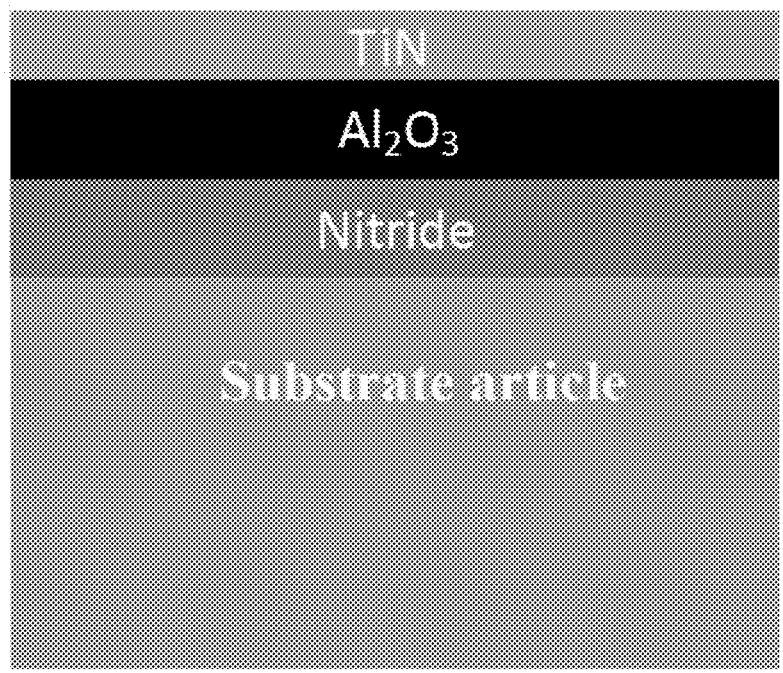
FIG. 3 is a schematic figure of a triple-layer coating consisting of a hard nitride interlayer and an $Al_2O_3$ coating layer, and a TiN top layer according to one implementation of the present invention.

In another implementation of the present invention, as shown in FIG. 3, the coating layer consists of at least two layers, i.e. a hard nitride layer and an $Al_2O_3$ coating layer. Here the $Al_2O_3$ coating layer provides the thermal and chemical barrier, beneath which is a hard nitride interlayer adjacent to the substrate. More frequently, there is a TiN top layer for identifying the wear of coated cutting tools by naked eyes during machining because of the gold color of TiN. The thickness of the hard nitride interlayer, $Al_2O_3$ coating layer, and TiN marker layer is in the range of 1-10 μm, 1-10 μm, and 1-2 μm, respectively. The thickness of the $Al_2O_3$ layer and nitride layer is controlled by increasing or decreasing the deposition time.

Figure 4:
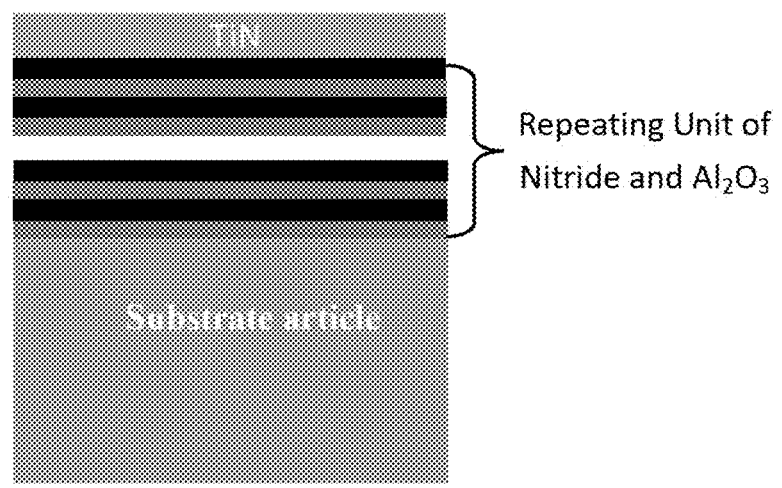
FIG. 4 is a schematic figure of a multilayered or nanolayered coating with at least 4 layers composed of alternating thin layers of hard nitride layer and $Al_2O_3$ coating layer, and a TiN top layer according to one implementation of the present invention.

In another implementation of the present invention, as shown in FIG. 4, the coating layer consists of alternating thin layers of hard nitride layers and $Al_2O_3$ layers. There are 4 to tens of hundreds of alternative hard nitride layer and $Al_2O_3$ coating layer with respective thickness of 5-20 nm to several μm (0.5-1.0 μm). The multilayered microstructure is in favor of the stress releasing, good adhesion and fatigue properties. More frequently, there is a TiN top layer with thickness of 1-2 μm for identifying the wear of coated cutting tools by naked eyes during machining. The thickness of individual layer is controlled by increasing or decreasing the deposition time.

In a preferable implementation of the present invention, the hard nitride interlayer/layer described above is a hard refractory nitride layer, i.e., binary nitride (TiN, CrN, etc.), ternary nitride (TiCN, TiAlN, etc.), or multi-component nitride (TiSiN, TiAlSiN, TiAlCrYN, etc.) layer or their multi-layers or nano layers, providing the high hot hardness in the temperature range of 600-1200° C., good toughness, good adherence of coating layers to the substrate, and a transition interlayer from the substrate to the $Al_2O_3$ coating layer to adjust values and distribution of residual stress and improve fatigue properties.

In a preferable implementation of the present invention, the hard nitride layer is fabricated by reactive sputtering of one or more metal or alloy target (Ti, Al, Cr, Si, TiAl, TiSi, AlCr, TiAlCr, TiAlY, etc.) in an $N_2$ gas or a gas mixture of Ar and $N_2$ with process pressure of 0.1-2 Pa at substrate temperature of 300-700° C. In all the cases, an asymmetrical bipolar pulsed power with reversed positive voltage (about 2-20% of the negative voltage) is applied as a bias voltage. During plasma etching, the negative bias voltage and the duty cycle is in the range of 300-1200V, 5-60%, respectively. During deposition, the negative bias voltage, the duty cycle ratio is in the range of 20-300V, 10-70%, respectively.

EXAMPLES

The present invention will be described in more details with the examples below, although the invention is not limited thereto.

Example 1

$Si_3N_4$ based ceramic cutting insert (with 5 wt % TiN and 5 wt % $Y_2O_3$ as additives) is used as substrate. Before being placed into the vacuum chamber for coating deposition, the inserts are grounded and polished to obtain a mirror like surface followed by ultrasonically cleaning in acetone and methanol bath sequentially before dried in $N_2$. The system was evacuated to a pressure below $5\times10^{-3}$ Pa. The coated articles are heated to 450° C. Then the surface of the cutting inserts are plasma cleaned and etched utilizing a high-frequency bipolar pulsed bias voltage for 30 min, at an Ar gas process pressure of 3 Pa. During plasma etching, the negative bias voltage and the duty cycle are 800V and 30%, respectively.

A single layer of $Al_2O_3$ coating with thickness of 3 μm is deposited utilizing reactive sputtering by bipolar pulsed DMS technique. A symmetrical bipolar pulsed power is applied on the pure Al cathode target. The $Al_2O_3$ layer is fabricated by reactive sputtering of Al target in a gas mixture of Ar and Oxygen with pressure of 0.5 Pa at substrate temperature of 450° C. During deposition, the positive and negative bias voltage is held at 30V and 200V, respectively. The frequency is 80 kHz while the duty cycle ratio is 40%.

Example 2

Example 1 is repeated by coating $Al_2O_3$ single layer on $Si_3N_4$ based ceramic inserts (with 10 wt % TiN and 5 wt % $Y_2O_3$ as additives).

Example 3

Example 1 is repeated by coating $Al_2O_3$ single layer on $Si_3N_4$ based ceramic inserts (with 15 wt % TiN and 5 wt % $Y_2O_3$ as additives).

Example 4

Example 1 is repeated by coating $Al_2O_3$ single layer on $Si_3N_4$ based ceramic inserts (with 5 wt % TiCN and 5 wt % $Y_2O_3$ as additives).

Example 5

A layer of 3 μm $Al_2O_3$ coating is deposited on the $Si_3N_4$ based ceramic inserts (with 5 wt % TiN+5 wt % $Y_2O_3$ as additives) by dual magnetron sputtering conductive $Al_2O_3$ ceramic targets. The conductive $Al_2O_3$ ceramic targets are made by sintering $Al_2O_3$ powders with 5 wt % pure metal Cr powder. The surface treatment before the deposition is applied using the same method as example 1.

An asymmetrical bipolar pulsed power with reversed positive voltage is applied on the cathode target which is $Al_2O_3$ ceramic sintered with 5 wt % pure metal Cr powder. The $Al_2O_3$ layer is fabricated by sputtering of conductively doped $Al_2O_3$ target in a gas mixture of 70% Ar and 30% $O_2$. The substrates temperature during the deposition is 450° C. with the process pressure of 0.5 Pa.

Example 6

A layer of 3 μm $Al_2O_3$ coating is deposited on the $Si_3N_4$ based ceramic inserts (with 10 wt % TiN and 5 wt % $Y_2O_3$ as additives) by dual magnetron sputtering conductive $Al_2O_3$ ceramic targets (with 5 wt % pure metal Cr as additive), using the same method as example 5.

Example 7

A layer of 3 μm $Al_2O_3$ coating is deposited on the $Si_3N_4$ based ceramic inserts (with 15 wt % TiN and 5 wt % $Y_2O_3$ as additives) by dual magnetron sputtering conductive $Al_2O_3$ ceramic targets (with 5 wt % pure metal Cr as additive), using the same method as example 5.

Example 8

A layer of 3 μm $Al_2O_3$ coating is deposited on the $Si_3N_4$ based ceramic inserts (with 5 wt % TiCN and 5 wt $Y_2O_3$ as additives) by dual magnetron sputtering conductive $Al_2O_3$ ceramic % targets (with 5 wt % pure metal Cr as additive), using the same method as example 5.

Example 9

A layer of 3 μm $Al_2O_3$ coating is deposited on the $Si_3N_4$ based ceramic inserts (with 5 wt % TiN and 5 wt % $Y_2O_3$ as additives) by dual magnetron sputtering conductive $Al_2O_3$ ceramic targets (with 3 wt % pure metal Cr powder as additive), using the same method as example 5.

Example 10

A layer of 3 μm $Al_2O_3$ coating is deposited on the $Si_3N_4$ based ceramic inserts with 5 wt % TiN and 5 wt % $Y_2O_3$ by dual magnetron sputtering conductive $Al_2O_3$ ceramic targets (with 1 wt % pure metal Cr powder as additive), using the same method as example 5.

Example 11

A layer of 3 μm $Al_2O_3$ coating is deposited on the $Si_3N_4$ based ceramic inserts with 5 wt % TiN and 5 wt % $Y_2O_3$ by dual magnetron sputtering conductive $Al_2O_3$ ceramic targets (with 5 wt % pure Pt metal powder as additive), using the same method as example 5.

Example 12

A layer of 3 μm $Al_2O_3$ coating is deposited on the $Si_3N_4$ based ceramic inserts with 5 wt % TiN and 5 wt % $Y_2O_3$ by dual magnetron sputtering conductive $Al_2O_3$ ceramic targets (with 5 wt % conductive SiC powder as additive), using the same method as example 5.

Example 13

A coating consisting of 3.0 μm TiN+3.0 μm $Al_2O_3$+1.0 μm TiN is deposited by PVD on $Si_3N_4$ based ceramic inserts (with 5% wt TiN+5 wt % $Y_2O_3$ as additives). The TiN layer is fabricated by reactive sputtering of Ti target in $N_2$ with process pressure of 1 Pa at substrate temperature of 400° C. An asymmetrical bipolar pulsed power with reversed positive voltage of 20V is applied as a bias voltage. During the deposition, the negative bias voltage is 200V, and the duty cycle ratio is 30%. The fabrication of $Al_2O_3$ layer is made by approach employed in Example 1.

Example 14

A coating consisting of 3.0 μm TiN+3.0 μm $Al_2O_3$+1.0 μm TiN is deposited by PVD on $Si_3N_4$ based ceramic inserts (with 5% wt TiN+5 wt % $Y_2O_3$ as additives). The deposition of TiN layer is made by approach employed in Example 13 while the fabrication of $Al_2O_3$ layer is made by approach employed in Example 5.

Example 15

A coating consisting of 3.0 μm TiAlN+3.0 μm $Al_2O_3$+1.0 μm TiN is deposited by PVD on $Si_3N_4$ based ceramic inserts (with 5% wt TiN+5 wt % $Y_2O_3$ as additives). The fabrication of $Al_2O_3$ layer is according to the Example 1. The TiAlN layer is fabricated by reactive sputtering of TiAl target in $N_2$ with process pressure of 1 Pa at substrate temperature of 400° C. An asymmetrical bipolar pulsed power with reversed positive voltage of 20V is applied as a bias voltage. During the deposition, the negative bias voltage is 200V, and the duty cycle ratio is 30%. The deposition of the top TiN layer is made by approach employed in Example 13.

Example 16

A coating consisting of 3.0 μm TiAlN+3.0 μm $Al_2O_3$+1.0 μm TiN is deposited by PVD on $Si_3N_4$ based ceramic inserts (with 5% wt TiN+5 wt % $Y_2O_3$ as additives). The fabrication of $Al_2O_3$ layer is according to the Example 5. The fabrication of TiAlN and TiN layers are made by approach employed in Example 15 and Example 13, respectively.

Example 17

A coating consisting of 2.0 μm TiAlN+3.0 μm $Al_2O_3$+1.0 μm TiN is deposited by PVD on $Si_3N_4$ based ceramic inserts (with 5% wt TiN+5 wt % $Y_2O_3$ as additives). The fabrication of $Al_2O_3$ layer is according to the Example 5. The fabrication of TiAlN and TiN layers are made by approach employed in Example 15 and Example 13, respectively.

Example 18

A coating consisting of 2.0 μm TiAlN+4.0 μm $Al_2O_3$+1.0 μm TiN is deposited by PVD on $Si_3N_4$ based ceramic inserts (with 5% wt TiN+5 wt % $Y_2O_3$ as additives). The fabrication of $Al_2O_3$ layer is based on Example 5. The fabrication of TiAlN and TiN layers are made by approach employed in Example 15 and Example 13, respectively.

Example 19

Multilayered coating consisting of 20 alternatively thin layers of TiAlN and $Al_2O_3$ with thickness of 1.0 μm each is fabricated by PVD technique on $Si_3N_4$ based ceramic inserts (with 5% wt TiN+5 wt % $Y_2O_3$ as additives). The deposition of TiAlN and $Al_2O_3$ are made by approaches employed in Example 15 and Example 1, respectively. Finally, a top layer of TiN with thickness of 1.0 μm is coated on the multilayered coating using the approach employed in Example 13.

Example 20

Multilayered coating consisting of 20 alternatively thin layers of TiAlN and $Al_2O_3$ with thickness of 1.0 μm each is fabricated by PVD technique on $Si_3N_4$ based ceramic inserts (with 5% wt TiN+5 wt % $Y_2O_3$ as additives). The deposition of TiAlN and $Al_2O_3$ are made by approaches employed in Example 15 and Example 5, respectively. Finally, a top layer of TiN with thickness of 1.0 μm is coated on the multilayered coating using the approach employed in Example 13.

Example 21

Multilayered coating consisting of 20 alternatively thin layers of TiAlN and $Al_2O_3$ with thickness of 0.5 μm each is fabricated by PVD technique on $Si_3N_4$ based ceramic inserts (with 5% wt TiN+5 wt % $Y_2O_3$ as additives). The deposition of TiAlN and $Al_2O_3$ are made by approaches employed in Example 15 and Example 1, respectively. Finally, a top layer of TiN with thickness of 1.0 μm is coated on the multilayered coating using the approach employed in Example 13.

Example 22

Multilayered coating consisting of 20 alternatively thin layers of TiAlN and $Al_2O_3$ with thickness of 0.5 μm each is fabricated by PVD technique on $Si_3N_4$ based ceramic inserts (with 5% wt TiN+5 wt % $Y_2O_3$ as additives). The deposition of TiAlN and $Al_2O_3$ are made by approaches employed in Example 15 and Example 5, respectively. Finally, a top layer of TiN with thickness of 1.0 μm is coated on the multilayered coating using the approach employed in Example 13.

Example 23

Nanolayered coating consisting of 100 alternatively thin layers of TiAlN and $Al_2O_3$ with thickness of 10 nm each is fabricated by PVD technique on $Si_3N_4$ based ceramic inserts (with 5% wt TiN+5 wt % $Y_2O_3$ as additives). The deposition of the alternatively thin layers is made by approach employed in Example 20. Finally, a top layer of TiN with thickness of 1.0 μm is coated on the multilayered coating using the approach employed in Example 13.

Example 24

Nanolayered coating consisting of 100 alternatively thin layers of TiAlN and $Al_2O_3$ with thickness of 10 nm each is fabricated by PVD technique on $Si_3N_4$ based ceramic inserts (with 30% wt TiN as additive). The deposition of the alternatively thin layers is made by approach employed in Example 21. Finally, a top layer of TiN with thickness of 1.0 μm is coated on the multilayered coating using the approach employed in Example 13.

Example 25

Nanolayered coating consisting of 50 alternatively thin layers of TiAlN and $Al_2O_3$ with thickness of 10 nm each is fabricated by PVD technique on $Si_3N_4$ based ceramic inserts (with 5% wt TiN+5 wt % $Y_2O_3$ as additives). The deposition of the alternatively thin layers is made by approach employed in Example 20. Finally, a top layer of TiN with thickness of 1.0 μm is coated on the multilayered coating using the approach employed in Example 13.

Example 26

Nanolayered coating consisting of 50 alternatively thin layers of TiAlN and $Al_2O_3$ with thickness of 10 nm each is fabricated by PVD technique on $Si_3N_4$ based ceramic inserts (with 30 wt % TiN as additives). The deposition of the alternatively thin layers is made by approach employed in Example 21. Finally, a top layer of TiN with thickness of 1.0 μm is coated on the multilayered coating using the approach employed in Example 13.

Example 27

Nanolayered coating consisting of 100 alternatively thin layers of TiAlN and $Al_2O_3$ with thickness of 15 nm each is fabricated by PVD technique on $Si_3N_4$ based ceramic inserts (with 5% wt TiN+5 wt % $Y_2O_3$ as additives). The deposition of the alternatively thin layers is made by approach employed in Example 20. Finally, a top layer of TiN with thickness of 1.0 μm is coated on the multilayered coating using the approach employed in Example 13.

Example 28

Nanolayered coating consisting of 100 alternatively thin layers of TiAlN and $Al_2O_3$ with thickness of 15 nm each is fabricated by PVD technique on $Si_3N_4$ based ceramic inserts (with 30 wt % TiN as additive). The deposition of the alternatively thin layers is made by approach employed in Example 21. Finally, a top layer of TiN with thickness of 1.0 μm is coated on the multilayered coating using the approach employed in Example 13.

Example 29

Nanolayered coating consisting of 50 alternatively thin layers of TiAlN and $Al_2O_3$ with thickness of 15 nm each is fabricated by PVD technique on $Si_3N_4$ based ceramic inserts (with 30 wt % TiN as additive). The deposition of the alternatively thin layers is made by approach employed in Example 21. Finally, a top layer of TiN with thickness of 1.0 μm is coated on the multilayered coating using the approach employed in Example 13.

Example 30

Nanolayered coating consisting of 50 alternatively thin layers of TiAlN and $Al_2O_3$ with thickness of 15 nm each is fabricated by PVD technique on $Si_3N_4$ based ceramic inserts (with 30 wt % TiN as additive). The deposition of the alternatively thin layers is made by approach employed in Example 21. Finally, a top layer of TiN with thickness of 1.0 μm is coated on the multilayered coating using the approach employed in Example 13.

It should be understood that various example embodiments have been described with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

What is claimed is:

1. An $Al_2O_3$ coated $Si_3N_4$ cutting tool comprising a conductive or non-conductive $Si_3N_4$ based substrate body and a coating layer on the substrate body, wherein the coating layer has at least one $Al_2O_3$ coating layer consisting of amorphous $Al_2O_3$ or nanocrystalline α-, γ-, or κ-$Al_2O_3$, wherein the $Al_2O_3$ coating layer is deposited: (a) on a conductive $Si_3N_4$ based substrate body by sputtering conductive $Al_7O_3$ ceramic target formed by doping conductive material in $Al_7O_3$; (b) on a conductive $Si_3N_4$ based substrate body utilizing reactive sputtering of Al cathode in an $O_2$ gas or a gas mixture of Ar and $O_2$ by bipolar pulsed DMS technique; (c) on a non-conductive $Si_3N_4$ based substrate body utilizing reactive sputtering of Al cathode in an $O_2$ gas or a gas mixture of Ar and $O_2$ by bipolar pulsed DMS technique and using a dual pulsed bias voltage; or (d) on a non-conductive $Si_7N_4$ based substrate body utilizing sputtering conductive $Al_7O_3$ ceramic target in an Ar gas or a gas mixture of Ar and $O_2$ and using a dual pulsed bias voltage.

2. The $Al_2O_3$ coated $Si_3N_4$ cutting tool of claim 1, wherein the $Al_2O_3$ coating layer is deposited with process pressure of 0.1-2 Pa at substrate temperature of 300-700° C.

3. The $Al_2O_3$ coated $Si_3N_4$ cutting tool of claim 2, wherein the conductive $Al_2O_3$ ceramic target consists of $Al_2O_3$ and 0.3-20 wt % doping material comprising Al, Ti, Cr, Nb, Pt or SiC.

4. The $Al_2O_3$ coated $Si_3N_4$ cutting tool of claim 1, wherein the conductive $Si_3N_4$ based substrate body consists of $Si_3N_4$-based composite including, but not limited to, $Si_3N_4$—TiN, $Si_3N_4$—TiC, $Si_3N_4$—$MoSi_2$, $Si_3N_4$—SiC, $Si_3N_4$—TiCN, $Si_3N_4$—$TiB_2$ or $Si_3N_4$—$MoSi_2$—SiC, and the $Al_2O_3$ coating layer is deposited utilizing physical vapor deposition technique.

5. The $Al_2O_3$ coated $Si_3N_4$ cutting tool of claim 4, wherein the TiC, TiN, TiCN, SiC, $MoSi_2$, $TiB_2$ and $MoSi_2$—SiC comprises 3-5 wt % of the substrate body.

6. The $Al_2O_3$ coated $Si_3N_4$ cutting tool of claim 4, wherein the $Si_3N_4$ based composite has a density of at least 98% of theoretical density using ceramic processing including sintering after pressing, hot pressing, gas pressure sintering, or hot isostatic pressing in a non-oxidizing atmosphere.

7. The $Al_2O_3$ coated $Si_3N_4$ cutting tool of claim 1, wherein the conductive or non-conductive $Si_3N_4$ based substrate body comprises a refractory phase comprising a densification additive selected from a group consisting of $SiO_2$, $Al_2O_3$, MgO, $Y_2O_3$, $HfO_2$, $ZrO_2$, $La_2O_3$ and mixtures thereof.

8. The $Al_2O_3$ coated $Si_3N_4$ cutting tool of claim 7, wherein the densification additive comprises 1-25 wt % of the substrate body.

9. The $Al_2O_3$ coated $Si_3N_4$ cutting tool of claim 8, wherein the densification additive comprises 1-5 wt %, of the substrate body.

10. The $Al_2O_3$ coated $Si_3N_4$ cutting tool of claim 1, wherein the coating layer has a total thickness of 1-20 μm.

11. The $Al_2O_3$ coated $Si_3N_4$ cutting tool of claim 10, wherein the coating layer has a total thickness of 2-10 μm.

12. The $Al_2O_3$ coated $Si_3N_4$ cutting tool of claim 11, wherein the coating layer has a total thickness of 3-8 μm.

13. The $Al_2O_3$ coated $Si_3N_4$ cutting tool of claim 1, wherein before the coating layer is deposited, the substrate body is grounded or polished or gently wet/dry blasted and cleaned and then moved into a vacuum chamber having a base pressure of $10^{-4}$-$10^{-2}$ Pa of a coating equipment, followed by plasma cleaning and etching by plasma etching utilizing a high-frequency bipolar pulsed bias voltage or an ion source for 2-60 min, at an Ar gas or a gas mixture of Ar and $O_2$ with process pressure of 0.1-10 Pa.

14. The $Al_2O_3$ coated $Si_3N_4$ cutting tool of claim 13, wherein before the coating layer is deposited, the substrate body is grounded or polished or gently wet/dry blasted and cleaned and then moved into a vacuum chamber having a base pressure of $10^{-4}$-$10^{-2}$ Pa of a coating equipment, followed by plasma cleaning and etching by plasma etching utilizing a high-frequency bipolar pulsed bias voltage or an ion source for 5-30 min, at an Ar gas or a gas mixture of Ar and $O_2$ with process pressure of 0.1-10 Pa.

15. The $Al_2O_3$ coated $Si_3N_4$ cutting tool of claim 1, wherein the coating layer consists of single $Al_2O_3$ coating layer with thickness of 1-10 μm.

16. The $Al_2O_3$ coated $Si_3N_4$ cutting tool of claim 1, wherein the coating layer consists of a hard nitride layer with thickness of 1-10 μm and an $Al_2O_3$ coating layer with thickness of 1-10 μm.

17. The $Al_2O_3$ coated $Si_3N_4$ cutting tool of claim 1, wherein the coating layer consists of 4 to tens of hundreds of alternating layers of hard nitride layers and $Al_2O_3$ layers with respective thickness of 5-20 nm to 0.5-1.0 μm.

18. The $Al_2O_3$ coated $Si_3N_4$ cutting tool of claim 1, wherein the coating layer has a TiN top layer with thickness of 1-2 μm on the surface of the coating layer.

19. The $Al_2O_3$ coated $Si_3N_4$ cutting tool of claim 16 or 17, wherein the hard nitride layer consists of TiN, CrN, TiCN, TiAlN, TiSiN, TiAlSiN, TiAlCrYN layer or their multi-layers or nano layers.

20. The $Al_2O_3$ coated $Si_3N_4$ cutting tool of claim 16 or 17, wherein the hard nitride layer is fabricated by reactive sputtering of one or more targets of Ti, Al, Cr, Si, TiAl, TiSi, AlCr, TiAlCr or TiAlY in an $N_2$ gas or a gas mixture of Ar and $N_2$ with process pressure of 0.1-2 Pa at substrate temperature of 300-700° C.

* * * * *